(12) United States Patent
Nagayama

(10) Patent No.: US 8,836,076 B2
(45) Date of Patent: Sep. 16, 2014

(54) SEMICONDUCTOR DEVICE AND METHOD OF MANUFACTURING THE SAME

(75) Inventor: Jun Nagayama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 345 days.

(21) Appl. No.: 13/050,071

(22) Filed: Mar. 17, 2011

(65) Prior Publication Data

US 2011/0317467 A1     Dec. 29, 2011

(30) Foreign Application Priority Data

Jun. 25, 2010   (JP) .................................. 2010-145003

(51) Int. Cl.

| | | |
|---|---|---|
| *H01L 27/112* | (2006.01) | |
| *G11C 17/14* | (2006.01) | |
| *G11C 17/16* | (2006.01) | |
| *G11C 17/18* | (2006.01) | |
| *H01L 27/06* | (2006.01) | |
| *H01L 27/10* | (2006.01) | |

(52) U.S. Cl.
CPC ........ *H01L 27/11206* (2013.01); *G11C 17/165* (2013.01); *G11C 17/16* (2013.01); *G11C 17/18* (2013.01); *H01L 27/0629* (2013.01); *H01L 27/101* (2013.01); *H01L 27/112* (2013.01)
USPC .................. 257/529; 257/530; 257/E27.102; 257/E27.103; 365/96

(58) Field of Classification Search
CPC ...... G11C 17/14; G11C 17/16; G11C 17/165; H01L 27/11206
USPC .............. 365/94, 96; 257/529–530, E23.147, 257/E23.149, E27.102, E27.103
See application file for complete search history.

(56) References Cited

U.S. PATENT DOCUMENTS

| | | | |
|---|---|---|---|
| 6,774,439 B2* | 8/2004 | Fukuzumi et al. | 257/360 |
| 6,897,543 B1* | 5/2005 | Huang et al. | 257/530 |
| 7,067,359 B2* | 6/2006 | Wu | 438/132 |
| 7,982,245 B2* | 7/2011 | Lim et al. | 257/209 |
| 2003/0062595 A1* | 4/2003 | Anthony | 257/530 |
| 2003/0098495 A1* | 5/2003 | Amo et al. | 257/530 |
| 2007/0205485 A1* | 9/2007 | Hsu et al. | 257/530 |
| 2008/0157125 A1* | 7/2008 | Kim et al. | 257/209 |
| 2008/0277756 A1* | 11/2008 | Min et al. | 257/529 |
| 2009/0101989 A1* | 4/2009 | Chen et al. | 257/379 |
| 2009/0267160 A1* | 10/2009 | Ichise | 257/369 |

FOREIGN PATENT DOCUMENTS

| | | |
|---|---|---|
| JP | 2007-194377 A | 8/2007 |
| JP | 2008-205096 A | 9/2008 |
| JP | 2008-227049 A | 9/2008 |
| WO | 2009/111187 A1 | 9/2009 |

OTHER PUBLICATIONS

Japanese Office Action dated Apr. 1, 2014, issued in Japanese Patent Application No. 2010-145003, w/English translation (8 pages).

* cited by examiner

*Primary Examiner* — Allison P Bernstein
(74) *Attorney, Agent, or Firm* — Westerman, Hattori, Daniels & Adrian, LLP

(57) ABSTRACT

A semiconductor device includes a memory element including a stack structure stacking an insulator film and a metal film or a metal compound film; and a transistor including a gate structure having an identical stack structure as that of the memory element.

9 Claims, 19 Drawing Sheets

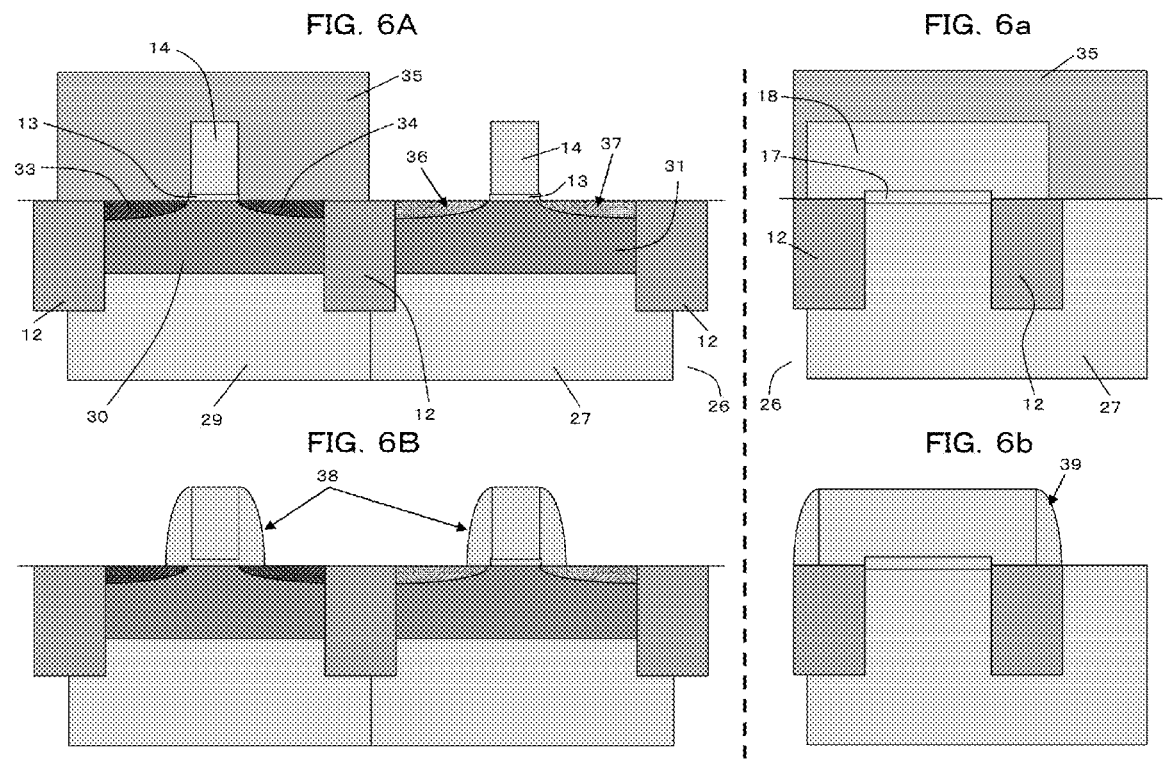

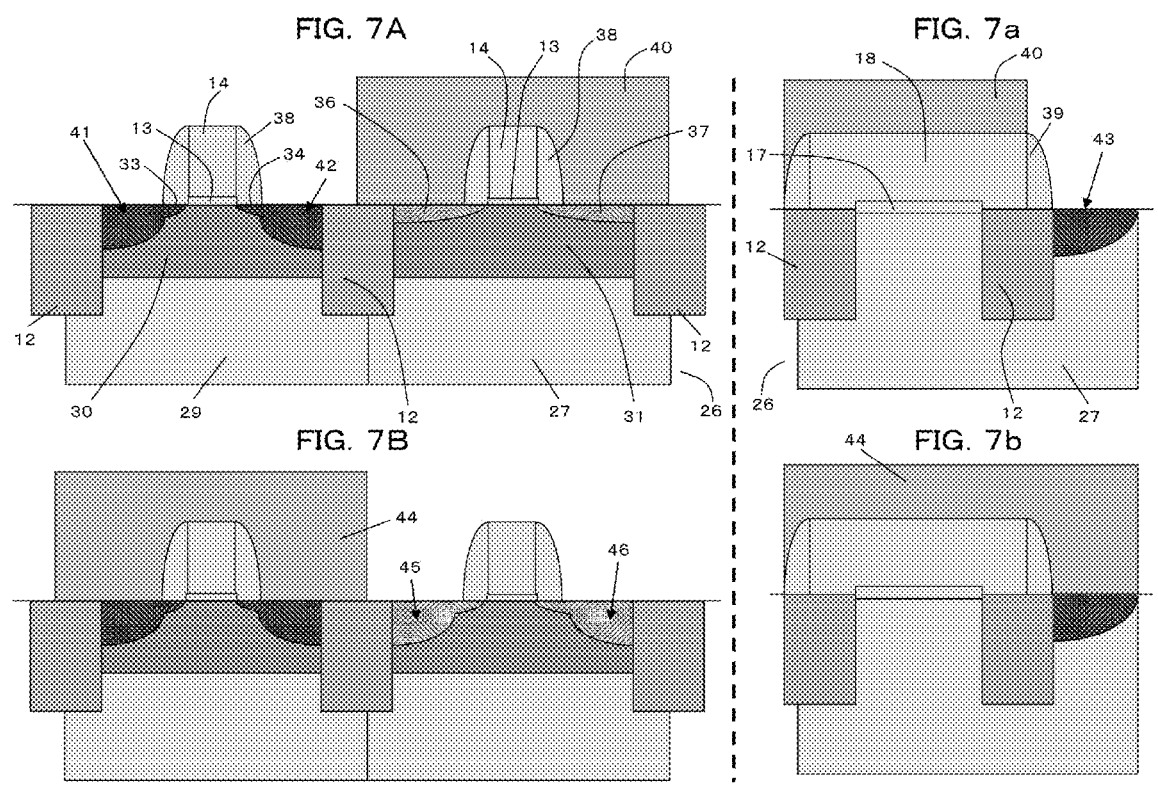

FIG. 11

| Program | PAD1 | PAD2 | Enable | nMOS | Fuse (Silicide) | Anti Fuse (Insulator film) |
|---|---|---|---|---|---|---|
| 1 | OPEN | OPEN | "0" | "off" | Short (No break) | Open (No break) |
| 2 | Voltage applied | OPEN | "1" | "on" | Open (Break) | Open (No break) |
| 3 | OPEN | Voltage applied | "1" | "on" | Short (No break) | Short (Break) |
| 4 | Voltage applied | Voltage applied | "1" | "on" | Open (Break) | Short (Break) |

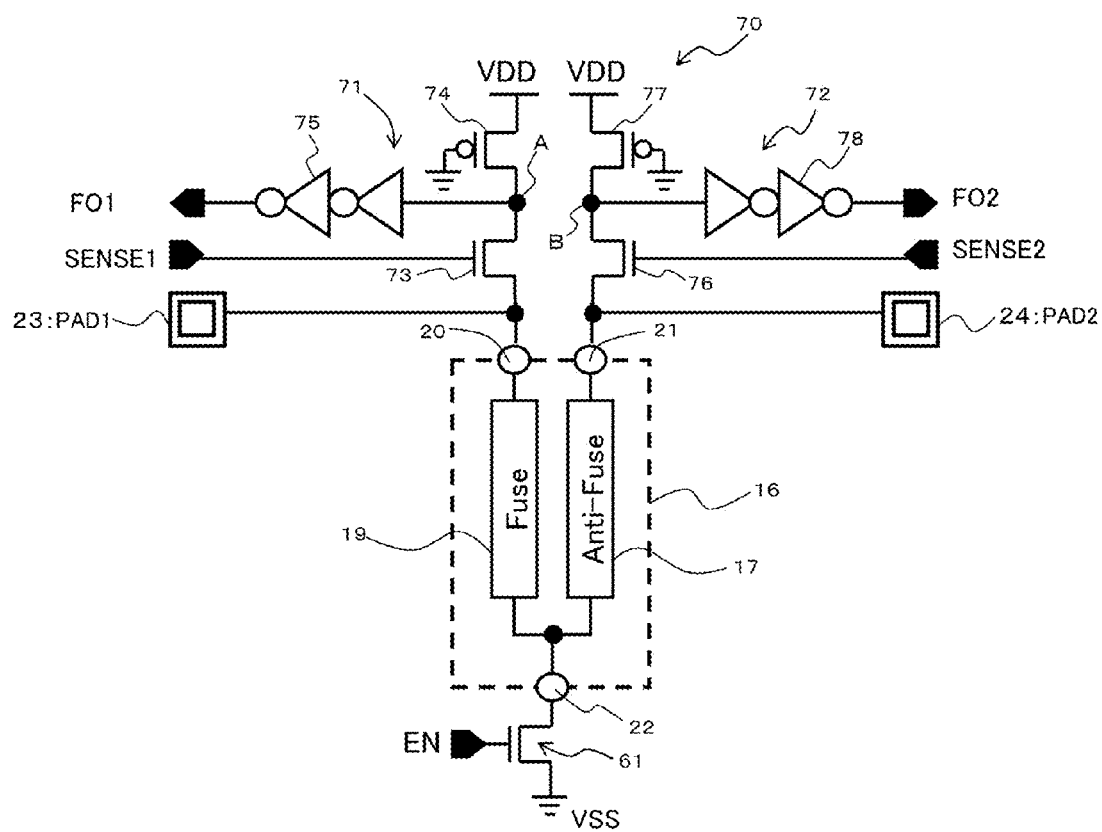

FIG. 14

| Fuse | Anti-Fuse | FO1 | FO2 |
|---|---|---|---|
| No break | No break | "L" | "H" |
| Break | No break | "H" | "H" |
| No break | Break | "L" | "L" |
| Break | Break | "H" | "L" |

US 8,836,076 B2

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2010-145003, filed on Jun. 25, 2010, the entire contents of which are incorporated herein by reference.

FIELD

The embodiment discussed herein is related to a semiconductor device and a method of manufacturing the same.

BACKGROUND

One-time programming (OTP) elements have been employed as memory elements, which are programmable only once.

OTP elements can be used for various purposes, including rescuing fail bits in a memory chip, writing chip identification data (ID) or an encryption code for preventing unauthorized use, or trimming an analog element after it is manufactured.

OTP elements include one type programmed by using the conductivity of a conductive film (the former type is referred to as fuse elements), and another type programmed by inducing or not inducing insulation breakdown in an insulator film (the latter type is referred to as anti-fuse elements).

Another technique has been also known in which a fuse is provide right above an anti-fuse, sandwiching an interlayer insulating film interposed therebetween, thereby reducing a space occupied thereby, together with coupling the anti-fuse and the fuse in parallel, such that the disconnected route can be reconnected once again, to enable reprogramming only once.

SUMMARY

According to an aspect of the embodiment, a semiconductor device includes: a memory element including a stack structure stacking an insulator film and a metal film or a metal compound film; and a transistor including a gate structure having an identical stack structure as that of the memory element.

According to another aspect of the embodiment, a method of manufacturing a semiconductor device includes: forming identical insulator films simultaneously in a gate region of a transistor and in a memory element region; and forming identical metal films or metal compound films simultaneously over the insulator films of the gate region and the memory element region to form a memory element and a gate structure having an identical stack structure as that of the memory element simultaneously.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIGS. 6A, 6B, 6a, and 6b are schematic cross-sectional views illustrating the method of manufacturing a semiconductor device according to the present embodiment;

FIGS. 7A, 7B, 7a, and 7b are schematic cross-sectional views illustrating the method of manufacturing a semiconductor device according to the present embodiment;

FIG. 11 is a diagram illustrating a method of programming an OTP element included in a semiconductor device according to the present embodiment;

FIG. 13 is a diagram illustrating the structure of a sense circuit coupled to an OTP element included in a semiconductor device according to the present embodiment;

FIG. 14 is a diagram illustrating the relationship between the programmed states of an OTP element included in a semiconductor device according to the present embodiment and output signals from the sense circuit;

DESCRIPTION OF EMBODIMENT

In the technique described above, programming is carried out by cutting the fuse by means of laser light, which requires additional masks and additional processes, such as specialized process for opening a passivation film for exposing the fuse.

Accordingly, provision of a memory element is desired, which can be integrated into a semiconductor device including transistors, without requiring additional mask or additional process.

Hereinafter, a semiconductor device and a method of manufacturing the same according to an embodiment of the present embodiment will be described with reference to FIGS. 1-18.

A semiconductor device according to the present embodiment is a semiconductor device including transistors, as well as an OTP element as a memory element. This OTP element is a non-volatile memory element programmable only once.

The semiconductor device including transistors is a semiconductor storage device including plural transistors, e.g., a dynamic random access memory (DRAM) or a static random access memory (SRAM), or a semiconductor device including a semiconductor integrated circuit having plural transistors integrated therein.

Figure 2:
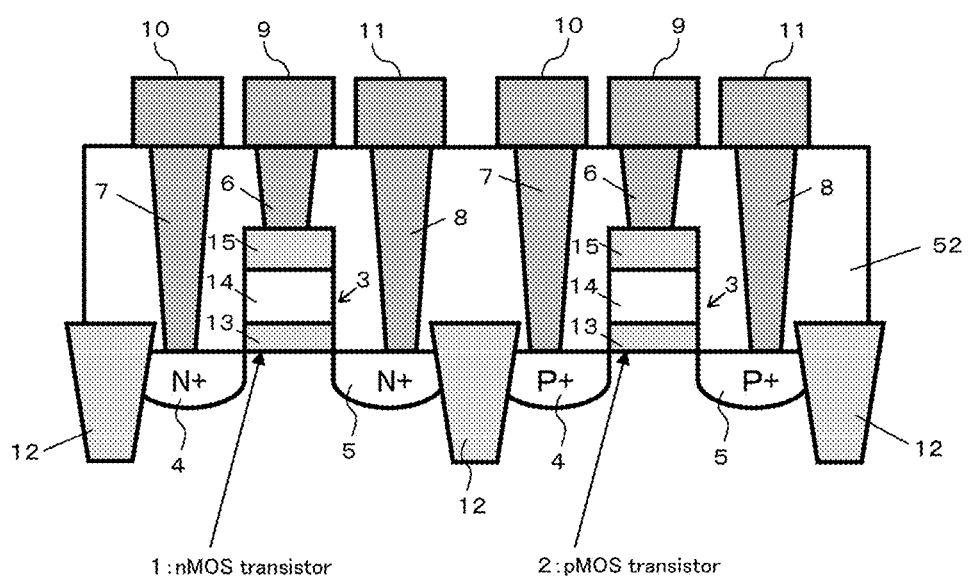
FIG. 2 is a schematic cross-sectional view illustrating the structures of transistors included in a semiconductor device according to the present embodiment.

In this embodiment, the semiconductor device is a semiconductor device including metal oxide semiconductor (MOS) transistors, i.e., metal oxide semiconductor field effect transistors (MOSFETs), as the transistors. In this embodiment, as depicted in FIG. 2, the semiconductor device is a semiconductor device that has a complementary MOS (CMOS) structure including an n-type channel MOS (nMOS) transistor 1 and a p-type channel MOS (pMOS) transistor 2.

Herein, each of the nMOS transistor 1 and the pMOS transistor 2 includes a gate electrode 3, a source region 4, and a drain region 5, wherein the source region 4 and the drain region 5 are coupled to interconnections 9-11 through the contact plugs 6-8. In FIG. 2, reference symbols 12 denote element isolation regions and reference symbol 52 denotes an interlayer insulating film.

The gate regions, i.e., gate structures, of the nMOS transistor 1 and the pMOS transistor 2 have a common structure wherein a gate electrode 3 is provided over an oxide film (insulator film) 13. The gate structures have triple-layered structures sequentially stacking an oxide film 13, a polysilicon film 14, and a metal silicide film (metal compound film; silicon metal compound film) 15. In this case, the metal silicide film 15 is a self-aligned silicide, namely, a metal salicide film.

The OTP element 16 also has the same stack structure as the gate structures described over, in which a gate electrode structure is provided over an oxide film (insulator film) 17. More specifically, similar to the above-described gate structures, the OTP element 16 has a triple-layered structure sequentially stacking an oxide film 17, a polysilicon film 18, and a metal silicide film (metal compound film; silicon metal compound film) 19. In this case, the metal silicide film 19 is a self-aligned silicide, namely, a metal salicide film. In such, the OTP element 16 has an MOS structure, like the transistors described above.

Accordingly, the OTP element 16 can be formed using a CMOS process for forming the semiconductor device including the transistors 1 and 2 described above, without requiring any additional mask or additional process, i.e., any specialized element formation process. This can help to reduce the cost.

In this case, the oxide film 17 in the OTP element 16 is identical to the oxide film 13 included in the above-described gate structures, and is an $SiO_2$ film, for example.

Although an oxide film is used for the insulator film herein, this is not limiting and a nitride film, such as an $Si_3N_4$ film, may be used, for example. More specifically, the transistors and the OTP element provided in the semiconductor device may have any suitable structure, as long as the transistors and the OTP element have the same structure. For example, metal insulator semiconductor (MIS) transistors may be used, i.e., a semiconductor device including MISFETs may have an OTP element having an MIS structure.

The polysilicon film 18 in the OTP element 16 is identical to the polysilicon film 14 included in the gate structures described above. Polysilicon films may be sometimes referred to as polycrystalline silicon films.

The metal silicide film 19 in the OTP element 16 is identical to the metal silicide films 15 included in the gate structures described above, and may be a cobalt silicide film or a nickel silicide film, for example.

The insulator film 17 in the OTP element 16 may undergo insulation breakdown when a voltage is applied, and therefore is programmable by inducing or not inducing insulation breakdown. The metal silicide film 19 in the OTP element 16 is broken by electromigration induced by a current flow, which modifies the conductivity of the metal silicide film 19. Thus, the metal silicide film 19 can be programmed by modifying the conductivity.

The break of the metal silicide film 19 also includes a case where the resistivity of the metal silicide film 19 is increased, in addition to the case where the metal silicide film 19 is cut. When the metal silicide film 19 is cut, the film 19 changes from conducting to non-conducting, and this change in the conductivity can be used for programming the film 19. Alternatively, when the resistivity of the metal silicide film 19 is increased, this film 19 changes from low resistive to high resistive, and this change in the conductivity can also be used for programming the film 19. In the case where a metal silicide film 19 is stacked on a polysilicon film 18 as in this embodiment, even if the metal silicide film 19 is broken by electromigration, some current still can flow through the conductive polysilicon film 18. However, the entire resistivity of the films is changed, which also presents some change in the conductivity.

Accordingly, the OTP element 16 includes, within a single element, a fuse element which can be programmed by modifying the conductivity of the metal silicide film 19, and an anti-fuse element which is programmable by inducing or not inducing insulation breakdown in the insulator film 17. More specifically, the OTP element 16 is programmable by inducing or not inducing insulation breakdown in the insulator film 17 and modifying the conductivity of the metal silicide film 19, and includes the metal silicide film 19 as a fuse element and the insulator film 17 as an anti-fuse element. Thus, the OTP element 16 can store four values (two bits) in a single element. Such an element is referred to as a multi-value storage OTP element.

The OTP element 16 having the fuse and anti-fuse elements 19 and 17 stacked together can help to reduce the element area (space occupied thereby). In general, since break of an OTP element, a fuse element, and an anti-fuse element is induced by applying a higher voltage or conducting a higher current, the elements must be spaced apart from surrounding elements, which results in increasing the space occupied thereby. In contrast, the OTP element 16 can help to reduce the space occupied thereby.

Herein, the fuse and anti-fuse elements 19 and 17 are electrically programmable elements. Therefore, they are referred to as an electrical fuse element and an electrical anti-fuse element. The fuse element 19 is also referred to as an electromigration-broken element. The anti-fuse element 17 is also referred to as a insulation breakdown element.

Two power-source-side contact plugs 20 and 21, and one ground-side contact plug 22 are provided to the OTP element 16. More specifically, one power-source-side contact plug 20 and one ground-side contact plug 22 are coupled to the metal silicide film 19 in the OTP element, while one power-source-side contact plug 21 is coupled to the insulator film 17.

In this case, since a p-type Si substrate 26 is used and the substrate 26 is grounded, the OTP element 16 is formed over a well 27, i.e., an n-type well, having a different conductive type than the conductive type of the substrate 26. The n-type well 27 extends to the outside of one of the element isolation regions 12, and a well tap 28 is formed in that region outside the n-type well 27. The power-source-side contact plug 21 is formed on the well tap 28. In this manner, the power-source-side contact plug 21 is coupled to the insulator film 17.

Figure 1:
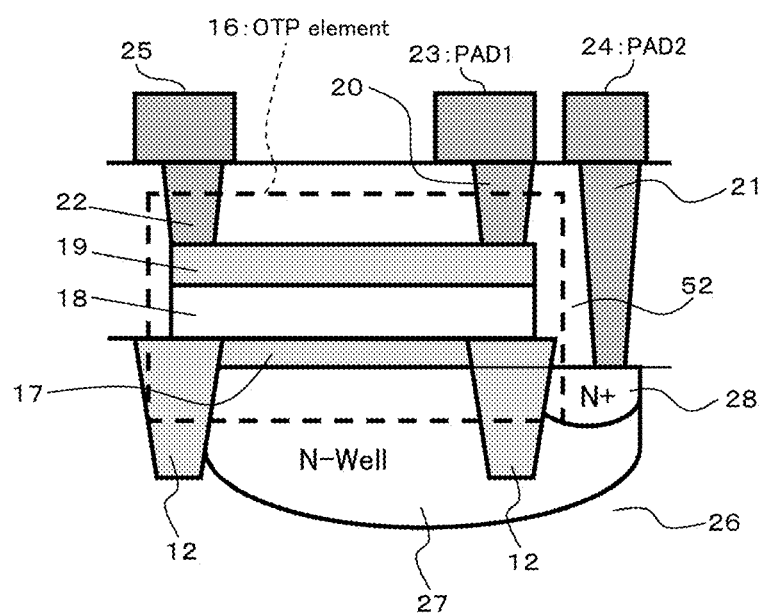
FIG. 1 is a schematic cross-sectional view illustrating the structure of an OTP element included in a semiconductor device according to the present embodiment.

The power-source-side contact plug 20 and the power-source-side contact plug 21 are coupled to a first pad 23 (electrode pad; PAD 1) and a second pad 24 (electrode pad; PAD 2), respectively, which enable application of higher voltages from a power source (not illustrated). In addition, an interconnection (metal interconnection) 25, which is coupled to the grounded p-type Si substrate 26 (which will be described later) via an nMOS transistor 61, is coupled to the ground-side contact plug 22 (see FIG. 10). In FIG. 1, reference symbols 12 denote element isolation regions and reference symbol 52 denotes an interlayer insulating film.

Next, a method of manufacturing a semiconductor according to this embodiment will be described with reference to FIGS. 3A to 8b.

Here, an explanation will be given in an example in which a semiconductor device, which includes transistors 1 and 2, and an OTP element 16 having the same stack structure as the transistors 1 and 2, is formed using a CMOS process.

Figure 3A:
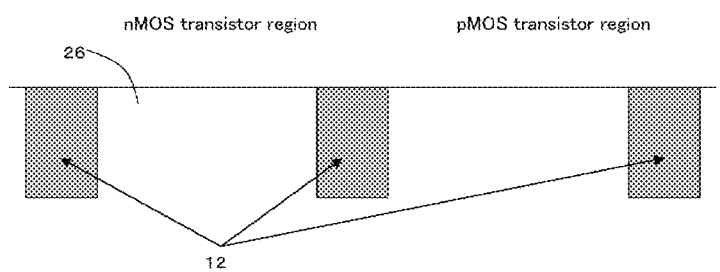
FIGS. 3A, 3B, 3a, and 3b are schematic cross-sectional views illustrating a method of manufacturing a semiconductor device according to the present embodiment.
Figure 3A:
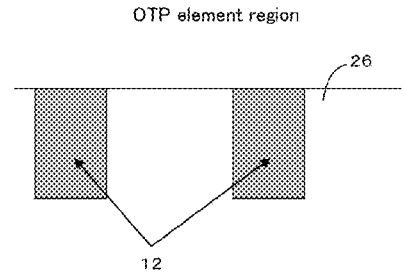

Firstly, as depicted in FIGS. 3A and 3a, shallow trenches are formed in an Si substrate 26 (p-type Si substrate, in this case) using the shallow trench isolation (STI) technique, for example, and the trenches are filled with an insulation material, such as $SiO_2$, for example, to define element isolation regions. As a result, an nMOSFET region, a pMOSFET region, and an OTP element region are defined.

Figure 3B:
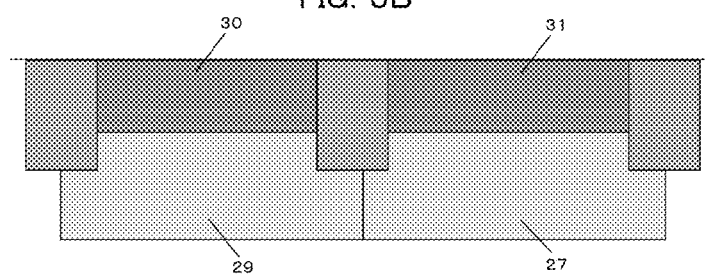
Figure 3B:
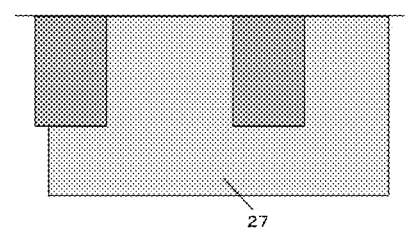

Subsequently, as depicted in FIGS. 3B and 3b, ion implant process is carried out to the Si substrate 26, using a resist mask (not illustrated), to define wells 27 and 29 and channels 30 and 31 for controlling the thresholds. In this case, the p-type well 29 and the p-type channel 30 are defined in the nMOS transistor region in the Si substrate 26, while the n-type well 27 and n-type channel 31 are defined in the pMOS transistor region, as well as defining the n-type well 27 in the OTP element region. An n-type channel 31 may also be defined in the OTP element region.

Figure 4A:
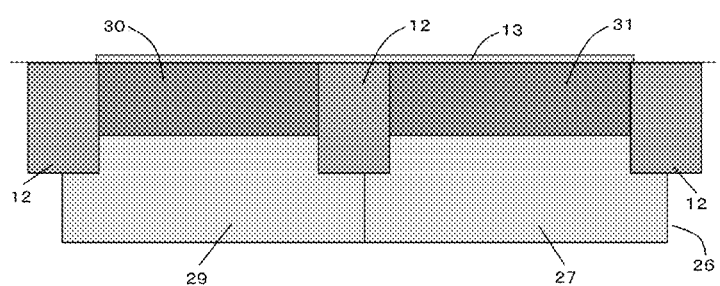
FIGS. 4A, 4B, 4a, and 4b are schematic cross-sectional views illustrating the method of manufacturing a semiconductor device according to the present embodiment.
Figure 4A:
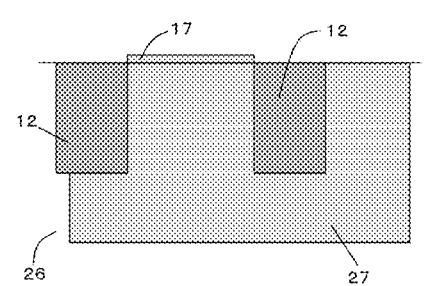

Subsequently, as depicted in FIGS. 4A and 4a, oxide films (insulator films) 13 and 17 to be included in gate structures and one OTP element 16 are formed on the nMOS transistor region, the pMOS transistor region, and the OTP element region in the Si substrate 26. In this case, identical oxide films 13 and 17 are simultaneously formed on the nMOS transistor region, the pMOS transistor region, and the OTP element region. The thicknesses of the oxide films 13 and 17 are adjusted by etching so as to be about 1 nm to about 2 nm.

Figure 4B:
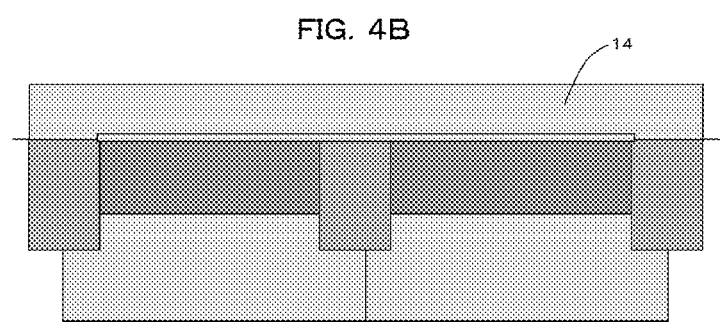
Figure 4B:
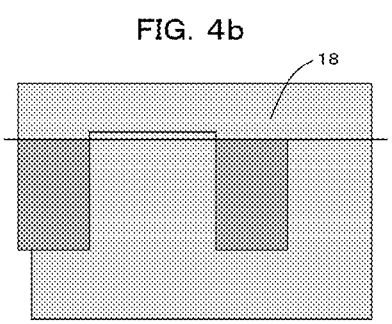

Subsequently, as depicted in FIGS. 4B and 4b, over the entire surface of the Si substrate 26, polysilicon films 14 and 18, to be included in the gate structures and the OTP element 16, are formed. In this case, identical polysilicon films 14 and 18 are simultaneously formed on the nMOS transistor region, the pMOS transistor region, and the OTP element region.

Figure 5A:
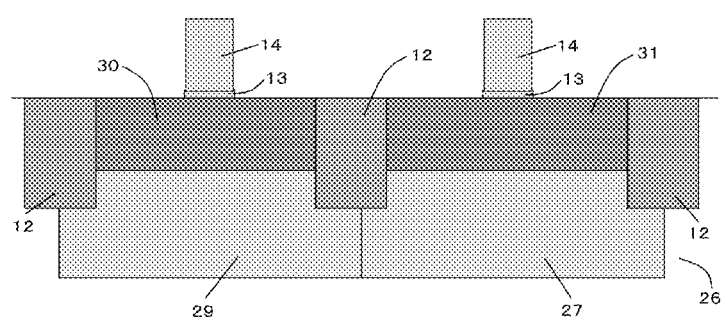
FIGS. 5A, 5B, 5a, and 5b are schematic cross-sectional views illustrating the method of manufacturing a semiconductor device according to the present embodiment.
Figure 5A:
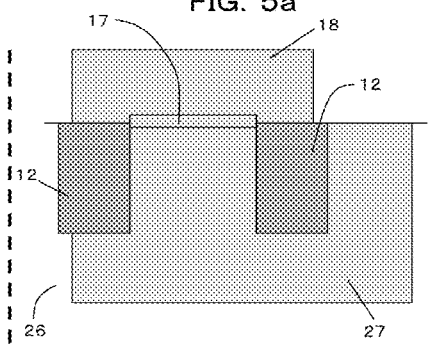

Subsequently, as depicted in FIGS. 5A and 5a, the oxide films 13 and 17 and the polysilicon films 14 and 18 are patterned by etching. As a result, respective dual-layered structures, stacking the polysilicon film 14 on the oxide film 13, are formed in the nMOS transistor region and the pMOS transistor region. In addition, a dual-layered structure, stacking the polysilicon film 18 on the oxide film 17, is also formed in the OTP element region.

In the processes described above, the identical oxide films 13 and 17 are simultaneously formed on the gate regions of the transistors 1 and 2 and the OTP element region, and thereafter the identical polysilicon films 14 and 18 are simultaneously formed on the oxide films 13 and 17 in the gate regions and the OTP element region.

Figure 5B:
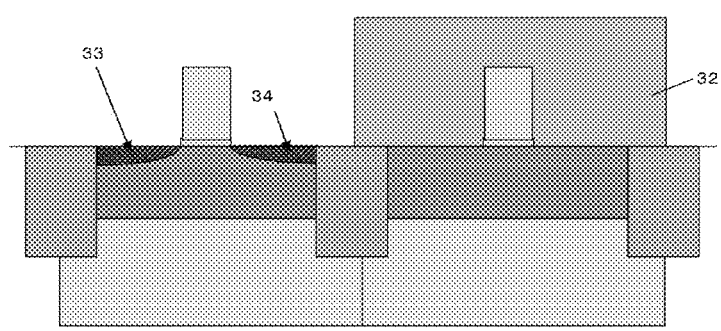
Figure 5B:
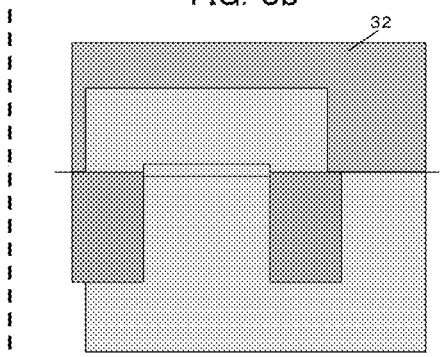

Subsequently, as depicted in FIGS. 5B and 5b, n-type impurities are ion implanted shallowly using a resist mask 32, in the both regions outside the gate structure of the nMOS transistor region, thereby forming extension diffusion layers 33 and 34.

Subsequently, as depicted in FIGS. 6A and 6a, p-type impurities are ion implanted shallowly using a resist mask 35, in the both regions outside the gate structure of the pMOS transistor region, thereby forming extension diffusion layers 36 and 37. Note that p-type impurities may be also ion implanted shallowly in the OTP element region in the similar manner for forming the extension diffusion layers 36 and 37, thereby forming an extension diffusion layer therein.

Subsequently, as depicted in FIGS. 6B and 6b, side wall spacers 38 and 39 are formed on the sides of the dual-layered structures formed as described above, by patterning and etching.

Subsequently, as depicted in FIGS. 7A and 7a, n-type impurities are ion implanted deeply using a resist mask 40, in the both regions outside the gate structure and the side wall spacers 38 of the nMOS transistor region, thereby forming a source diffusion layer 41 and a drain diffusion layer 42. Simultaneously, n-type impurities are ion implanted deeply into the region of the n-type well 27 extending outside of the element isolation regions 12 in the OTP element region, thereby forming a well tap diffusion layer 43.

Subsequently, as depicted in FIGS. 7B and 7b, p-type impurities are ion implanted deeply using a resist mask 44, in the both regions outside the gate structure and the side wall spacers 38 of the pMOS transistor region, thereby forming a source diffusion layer 45 and a drain diffusion layer 46. Note that p-type impurities may be also ion implanted deeply in the OTP element region in the similar manner for forming the source diffusion layer 45 and the drain diffusion layer 46, thereby forming a diffusion layer therein.

Figure 8A:
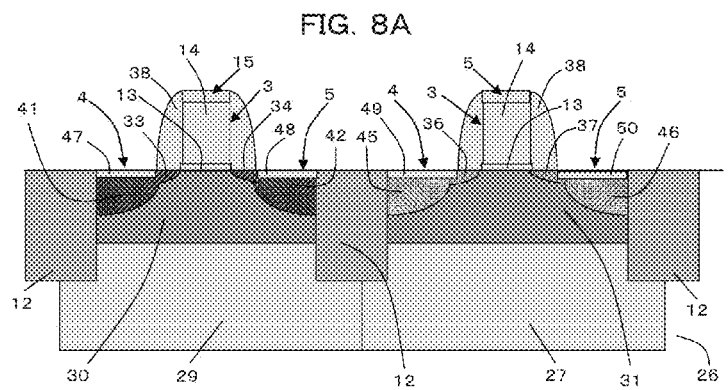
FIGS. 8A, 8B, 8a, and 8b are schematic cross-sectional views illustrating the method of manufacturing a semiconductor device according to the present embodiment.
Figure 8A:
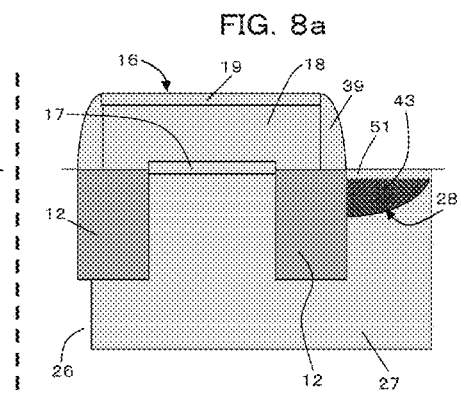

Subsequently, as depicted in FIGS. 8A and 8a, metal silicide films (metal compound films) 15, 19, and 47-51 are formed on the polysilicon films 14 and 18, the source diffusion layer 41, the drain diffusion layer 42, and the well tap diffusion layer 43. In this embodiment, after forming a metal film, etching and annealing are carried out to form the metal silicide films 15, 19, and 47-51 in a film thickness of about 10 nm to about 30 nm, for example, on the polysilicon films 14 and 18, the source diffusion layer 41, the drain diffusion layer 42, and the well tap diffusion layer 43. In the above-described manner, the identical metal silicide films 15 and 19 are simultaneously formed on the gate regions of the transistors 1 and 2 and the polysilicon films 14 and 18 of the OTP element region. In other words, the identical metal compound films 15 and 19 are simultaneously formed on the gate regions of the transistors 1 and 2 and the oxide films 13 and 17 of the OTP element region.

In the processes described above, the triple-layered gate structures, staking the oxide film 13, the polysilicon film 14, and the metal silicide film 15, are formed in the nMOS transistor region and the pMOS transistor region. More specifically, a gate structure including the oxide film 13 and the gate electrode 3 is formed. In addition, in the nMOS transistor region, the source region 4 having the metal silicide film 47 on the surface of the source diffusion layer 41 is formed, while the drain region 5 having the metal silicide film 48 on the surface of the drain diffusion layer 42 is formed. Furthermore, in the pMOS transistor region, the source region 4 having the metal silicide film 49 on the surface of the source diffusion layer 45 is formed, while the drain region 5 having the metal silicide film 50 on the surface of the drain diffusion layer 46 is formed.

In addition, in the OTP element region, the OTP element 16 in a triple-layered structure, stacking the oxide film 17, the polysilicon film 18, and the metal silicide film 19, is formed. In addition, the well tap 28 having the metal silicide film 51 on the surface of the well tap diffusion layer 43 is formed.

Figure 8B:
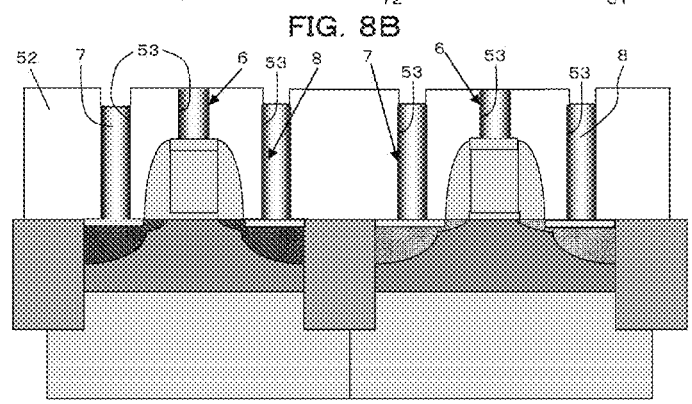
Figure 8B:
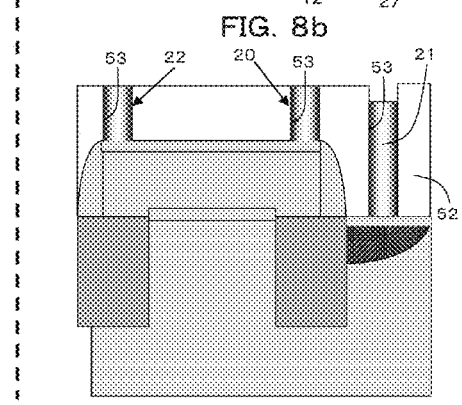

Subsequently, as depicted in FIGS. 8B and 8b, after forming an interlayer insulating film 52 over the entire surface, contact holes 53 are formed, in which a contact plug material (metal material) is filled, thereby forming contact plugs 6-8 and 20-22.

Herein, in the nMOS transistor region and the pMOS transistor region, the contact plugs 6-8 are coupled to the gate structures including the gate electrodes 3, the source regions 4, and the drain regions 5, respectively. More specifically, one contact plug 6 is formed on a metal silicide film 15 defining the top layer of the gate structure. In addition, one contact plug 7 is formed on each of the metal silicide films 47 and 49 formed on the surface of the source region 4. Furthermore, one contact plug 8 is formed on each of the metal silicide films 48 and 50 formed on the surface of the drain region 5.

In addition, in the OTP element region, the contact plugs 20-22 are coupled on the OTP element 16 and the well tap 28. More specifically, two contact plugs, i.e., one power-source-side contact plug 20 and one ground-side contact plug 22, are formed on the metal silicide film 19 defining the top layer of the OTP element 16. In addition, one power-source-side contact plug 21 is formed on the metal silicide film 51 formed on the surface of the well tap 28. More specifically, the one power-source-side contact plug 21 is formed, which is coupled to the oxide film 17 of the OTP element 16 via the n-type well 27 and the well tap 28.

Thereafter, steps of forming interconnection layers (not illustrated) are carried out, and a semiconductor device including the transistors 1 and 2 and the OTP element 16 having the same stack structure as that of the transistors 1 and 2 is completed.

Herein, in the OTP element region, interconnections for coupling a programming circuit 60 and a sense circuit 70, which will be described later, and a first pad 23 and a second pad 24 are formed such that they are coupled to each of the power-source-side contact plug 20 formed on the OTP element 16 and the power-source-side contact plug 21 formed on the well tap 28 (see FIG. 10). In addition, in the nMOS transistor region and the pMOS transistor region, the interconnections 9-11 are formed (see FIG. 2).

Although this embodiment has been described in the example in which the transistors 1 and 2 having CMOS structures are formed, transistors included in a programming circuit 60 and a sense circuit 70, which are to be coupled to the OTP element 16 and will be described later, are formed in the similar manner.

Figure 9:
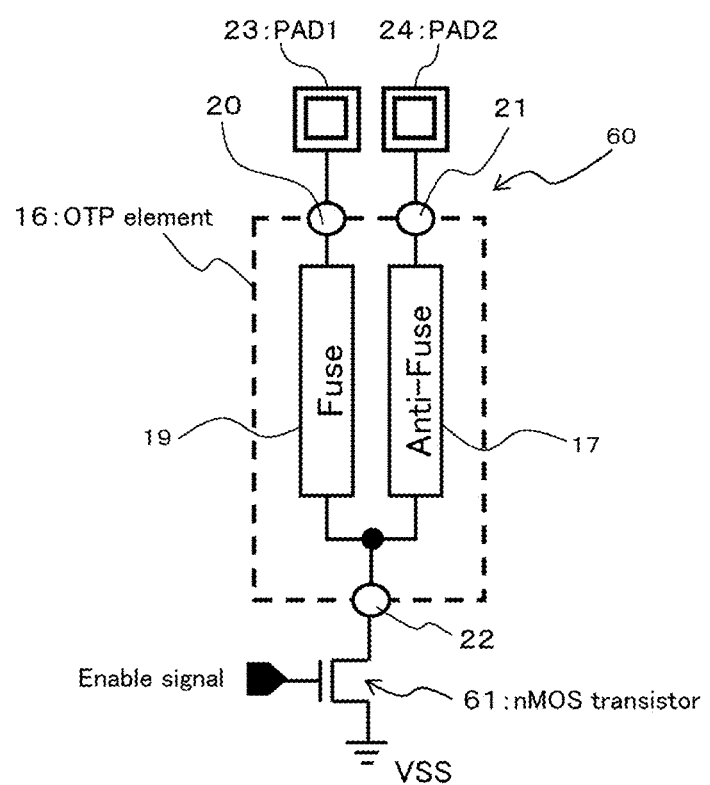
FIG. 9 is a diagram illustrating the structure of a programming circuit coupled to an OTP element included in a semiconductor device according to the present embodiment.
Figure 10:
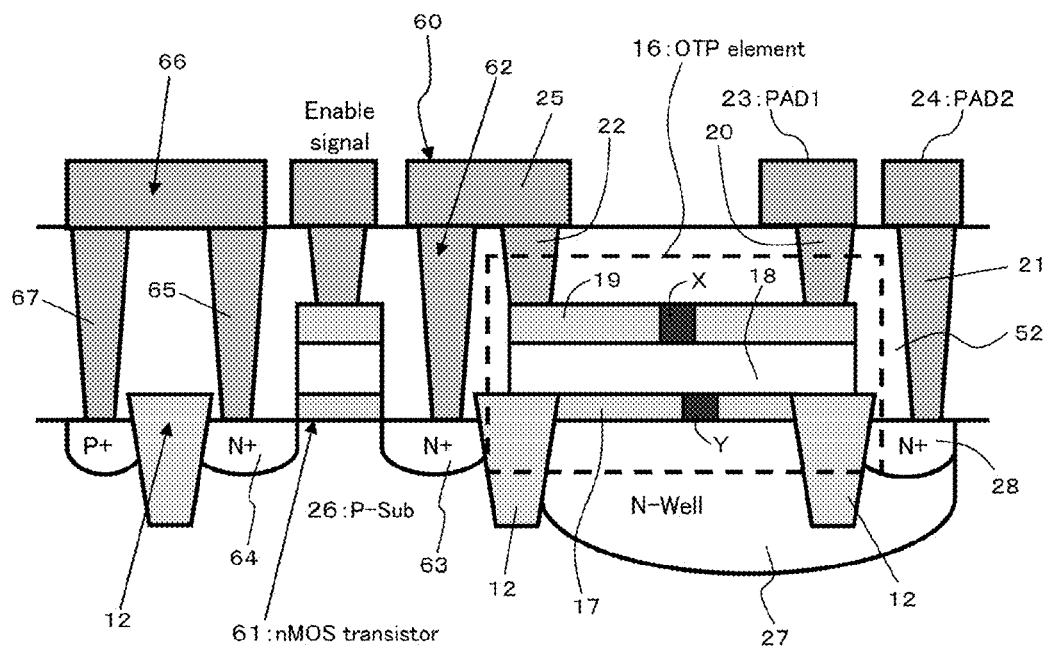
FIG. 10 is a schematic cross-sectional view illustrating the structure of a programming circuit coupled to an OTP element included in a semiconductor device according to the present embodiment.
Figure 12A:
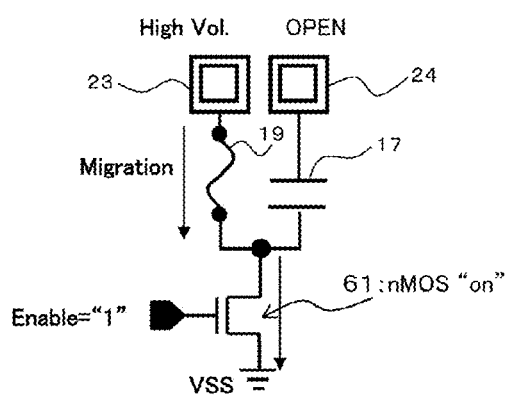
FIG. 12A is a diagram illustrating a method of programming a fuse element included in a semiconductor device according to the present embodiment.
Figure 12B:
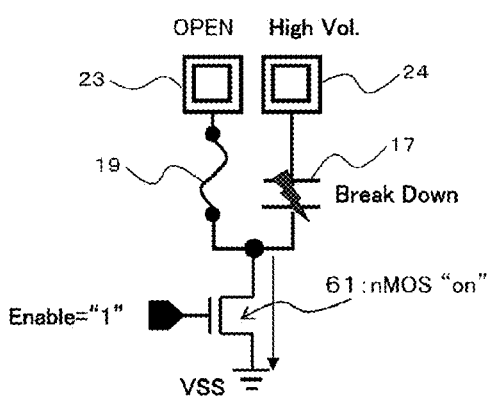
FIG. 12B is a diagram illustrating a method of programming an anti-fuse element included in a semiconductor device according to the present embodiment.

A semiconductor device of this embodiment includes a programming circuit 60 for programming the OTP element 16 as depicted in FIG. 9 and FIG. 10. In this embodiment, the programming circuit 60 includes first and second pads 23 and 24 coupled to the OTP element 16 via the two power-source-side contact plugs 20 and 21, respectively, and an n-type channel MOS (nMOS) transistor, i.e., n-type channel MOS-FET 61, coupled to the OTP element 16 via the one ground-side contact plug 22. In this embodiment, as depicted in FIG. 10, the drain region 63 of the nMOS transistor 61 is coupled to the one ground-side contact plug 22, via an interconnection 25 and a contact plug 62. In addition, the source region 64 of the nMOS transistor 61 is coupled to the p-type Si substrate 26 and is grounded, via a contact plug 65, an interconnection 66, and a contact plug 67. Note that the broken portion of the fuse element (metal silicide film) 19 is indicated by reference symbol X, while the breakdown portion of the anti-fuse element (insulator film) 17 is indicated by reference symbol Y in FIG. 10.

More specifically, as depicted in FIG. 9, the OTP element 16 includes two terminals 20 and 21 coupled to the fuse and anti-fuse elements 19 and 17, respectively, on the power source side, and one terminal 22 (common terminal) coupled to both of the fuse and anti-fuse elements 19 and 17, on the ground side. To the OTP element 16, the programming circuit 60 is coupled, which includes the first and second pads 23 and 24 coupled to two power-source-side terminals 20 and 21, respectively, and an nMOS transistor 61 (common circuit) coupled to the one ground-side terminal 22. Note that the programming circuit 60 is also referred to as a disconnecting circuit or writing circuit.

As described above, the programming circuit 60 can be shared for the fuse and anti-fuse elements 19 and 17 included in the OTP element 16 by providing the three terminals 20-22 to a single OTP element 16, thereby enabling reduction in the area (space occupied thereby) of the programming circuit 60. In general, an OTP element, a fuse element, and an anti-fuse element are programmed by inducing break of the elements, such as by applying a higher voltage or conducting a higher current, which increases the area of a programming circuit. In contrast, the OTP element 16 can help to reduce the area of the programming circuit 60. This can help to reduce the cost.

In addition, the OTP element 16 can be used as a highly reliable memory element that can store a binary value (one bit). More specifically, the OTP element 16 employs two different modes of writing, wherein the fuse element 19 is programmable by utilizing electromigration in a metal silicide film, while the anti-fuse element 17 is programmable by inducing or not inducing dielectric breakdown in an insulator film. Therefore, their modes of break are also different, and accordingly in the case of break of one element (e.g., an once-disconnected line is reconnected), the possibility of any break of the other element is quite low. Thus, it is highly probable that the other element can function normally. Accordingly, when the OTP element 16 is used as a memory element storing a binary value (one bit), a higher reliability can be achieved.

The OTP element 16 is programmed in the following procedure using the programming circuit 60 constructed as described above.

The OTP element 16 can be programmed into four different states (four values; two bits), by combining break/no break of the fuse element (metal silicide film) 19, with break/no break of the anti-fuse element (insulator film) 17.

Firstly, without applying a voltage on the first and second pads 23 and 24 (i.e., keeping them OPEN), an enable signal to be sent to the gate of the nMOS transistor 61 is set to "0" to turn off the nMOS transistor 61. Under these conditions, both the fuse element (metal silicide film) 19 and the anti-fuse element (insulator film) 17 are not broken. As a result, a first state (first value), in which the fuse element 19 is not broken (Short) and the anti-fuse element 17 is not broken (Open), is written into the OTP element 16.

Next, while applying a voltage on the first pad 23 without applying a voltage on the second pad 24 (i.e., keeping it OPEN), an enable signal to be sent to the gate of the nMOS transistor 61 is set to "1" to turn on the nMOS transistor 61. Under these conditions, the fuse element (metal silicide film) 19 is broken by electromigration (see FIG. 12A), while the anti-fuse element (insulator film) 17 is not broken. As a result, a second state (second value), in which the fuse element 19 is broken (Open) and the anti-fuse element 17 is not broken (Open), is written into the OTP element 16.

Next, while applying a voltage on the second pad 24 without applying a voltage on the first pad 23 (i.e., keeping it OPEN), an enable signal to be sent to the gate of the nMOS transistor 61 is set to "1" to turn on the nMOS transistor 61. Under these conditions, the fuse element (metal silicide film) 19 is not broken while insulation breakdown of the anti-fuse element (insulator film) 17 occurs (see FIG. 12B). As a result, a third state (third value), in which the fuse element 19 is not broken (Short) while the anti-fuse element 17 is broken (Short), is written into the OTP element 16.

Next, while applying voltages both on the first and second pads 23 and 24, an enable signal to be sent to the gate of the nMOS transistor 61 is set to "1" to turn on the nMOS transistor 61. Under these conditions, the fuse element (metal silicide film) 19 is broken by electromigration (see FIG. 12A), and insulation breakdown of the anti-fuse element (insulator film) 17 occurs (see FIG. 12B). As a result, a fourth state (fourth value), in which the fuse element 19 is broken (Open) and the anti-fuse element 17 is broken (Short), is written into the OTP element 16.

As depicted in FIG. 13, a semiconductor device of the present embodiment includes a sense circuit 70 that detects a state of the OTP element 16.

The present embodiment includes a sense circuit 70 that is coupled to the two power-source-side contact plugs 20 and 21 and the one ground-side contact plug 22, and detects presence or absence of insulation breakdown in the oxide film 17 of the OTP element 16 and change in the conductivity of the metal silicide film 19. More specifically, the OTP element 16 includes two terminals 20 and 21 coupled to the fuse and anti-fuse elements 19 and 17, respectively, on the power source side, and one terminal 22 (common terminal) coupled to both of the fuse and anti-fuse elements 19 and 17, on the ground side. To the OTP element 16, the sense 70 is coupled which includes a fuse element circuit 71 and an anti-fuse element circuit 72 coupled to two power-source-side terminals 20 and 21, respectively, and an nMOS transistor 61 (common circuit) coupled to the one ground-side terminal 22. Note that the sense circuit 70 is also referred to as a read circuit.

In this embodiment, the fuse element circuit 71 and the anti-fuse element circuit 72 have the same circuit configuration, as depicted in FIG. 13.

More specifically, the fuse element circuit 71 includes an nMOS transistor (nMOSFET) 73 coupled to the power-source-side terminal 20 of the OTP element 16, a pMOS transistor (pMOSFET) 74 coupled to the MOS transistor 73, and a buffer 75 coupled to a node A between the MOS transistors 73 and 74.

Herein, the nMOS transistor 73 is transistor functioning as a switch for enabling the operation (sense mode) to detect the state of the fuse element 19 (break/no break). More specifically, the nMOS transistor 73 is a transistor functioning as a switch for enabling the operation (read mode) to read the state of the fuse element 19. The nMOS transistor 73 is also referred to as a sense operation transistor or a read operation transistor. Herein, the source of the nMOS transistor 73 is coupled to the power-source-side terminal 20 of the OTP element 16, while the drain of the nMOS transistor 73 is coupled to the source of the pMOS transistor 74 via the node A. A first sense signal (SENSE1) for enabling the sense operation is sent to the gate of the nMOS transistor 73.

The pMOS transistor 74 is a transistor functioning as a resistive element (reference load element) for comparing against the element resistance of the fuse element 19 during the sense mode. Herein, the gate of the pMOS transistor 74 is grounded, the drain of the pMOS transistor 74 is coupled to the power source line of the power source voltage VDD, and the source of the pMOS transistor 74 is coupled to the nMOS transistor 73 via the node A. The pMOS transistor 74 is also referred to as an on-resistance transistor.

The buffer 75 is a signal amplification buffer that amplifies the voltage at the node A and outputs the amplified signal as a first output signal (FO1) during the sense mode. During the sense mode, the node A assumes any intermediate potential, depending on the state of the fuse element 19. The voltage at the node A is amplified by the buffer 75 and is then output as the first output signal.

Similarly, the anti-fuse element circuit 72 includes an nMOS transistor (nMOSFET) 76 coupled to the power-source-side terminal 21 of the OTP element 16, a pMOS transistor (pMOSFET) 77 coupled to the MOS transistor 76, and a buffer 78 coupled to a node B between the MOS transistors 76 and 77.

Herein, the nMOS transistor 76 is transistor functioning as a switch for enabling the operation (sense mode) to detect the state of the anti-fuse element 17 (break/no break). More specifically, the nMOS transistor 76 is a transistor functioning as a switch for enabling the operation (read mode) to read the state of the anti-fuse element 17. The nMOS transistor 76 is also referred to as a sense operation transistor or a read operation transistor. Herein, the source of the nMOS transistor 76 is coupled to the power-source-side terminal 21 of the OTP element 16, while the drain of the nMOS transistor 76 is coupled to the source of the pMOS transistor 77 via the node B. A second sense signal (SENSE2) for enabling the sense operation is sent to the gate of the nMOS transistor 76.

The pMOS transistor 77 is a transistor functioning as a resistive element (reference load element) for comparing against the element resistance of the anti-fuse element 17 during the sense mode. Herein, the gate of the pMOS transistor 77 is grounded, the drain of the pMOS transistor 77 is coupled to the power source line of the power source voltage VDD, and the source of the pMOS transistor 77 is coupled to the nMOS transistor 76 via the node B. The pMOS transistor 77 is also referred to as an on-resistance transistor.

The buffer 78 is a signal amplification buffer that amplifies the voltage at the node B and outputs the amplified signal as a second signal (FO2) during the sense mode. During the sense mode, the node B assumes any intermediate potential, depending on the state of the anti-fuse element 17. The voltage at the node B is amplified by the buffer 78 and is then output as the second output signal.

The four different states, one of which can be programmed to the OTP element 16, can be distinguished from each other, using the sense circuit 70 as configured above.

During the sense mode, the first and second sense signals to be sent to the gates of the nMOS transistors 73 and 76 are set to "1", the enable signal to be sent to the gate of the nMOS transistor 61 is set to "1", and the first and second pads 23 and 24 are opened.

Herein, as depicted in FIG. 14, if the first state has been written in the OTP element 16, in which both the fuse element (metal silicide film) 19 and the anti-fuse element (insulator film) 17 are not broken, an "L"-level signal is output from the fuse element circuit 71 as the first output signal (FO1), while a "H"-level signal is output from the anti-fuse element circuit 72 as the second output signal (FO2).

Alternatively, if the second state has been written in the OTP element 16, in which the fuse element 19 is broken while the anti-fuse element 17 is not broken, a "H"-level signal is output from the fuse element circuit 71 as the first output signal (FO1) and a "H"-level signal is output from the anti-fuse element circuit 72 as the second output signal (FO2).

Alternatively, if the third state has been written in the OTP element 16, in which the fuse element 19 is not broken while the anti-fuse element 17 is broken, an "L"-level signal is output from the fuse element circuit 71 as the first output signal (FO1) and an "L"-level signal is output from the anti-fuse element circuit 72 as the second output signal (FO2).

Alternatively, if the forth state has been written in the OTP element 16, in which the fuse element 19 is broken and the anti-fuse element 17 is broken, a "H"-level signal is output from the fuse element circuit 71 as the first output signal (FO1), while an "L"-level signal is output from the anti-fuse element circuit 72 as the second output signal (FO2).

A more detailed descriptions of the operation of the sense circuit 70 will be presented with reference to two scenarios in which both the fuse and anti-fuse elements 19 and 17 are not broken (first state), and in which both the fuse element 19 and the anti-fuse element 17 are broken (fourth state).

Figure 15:
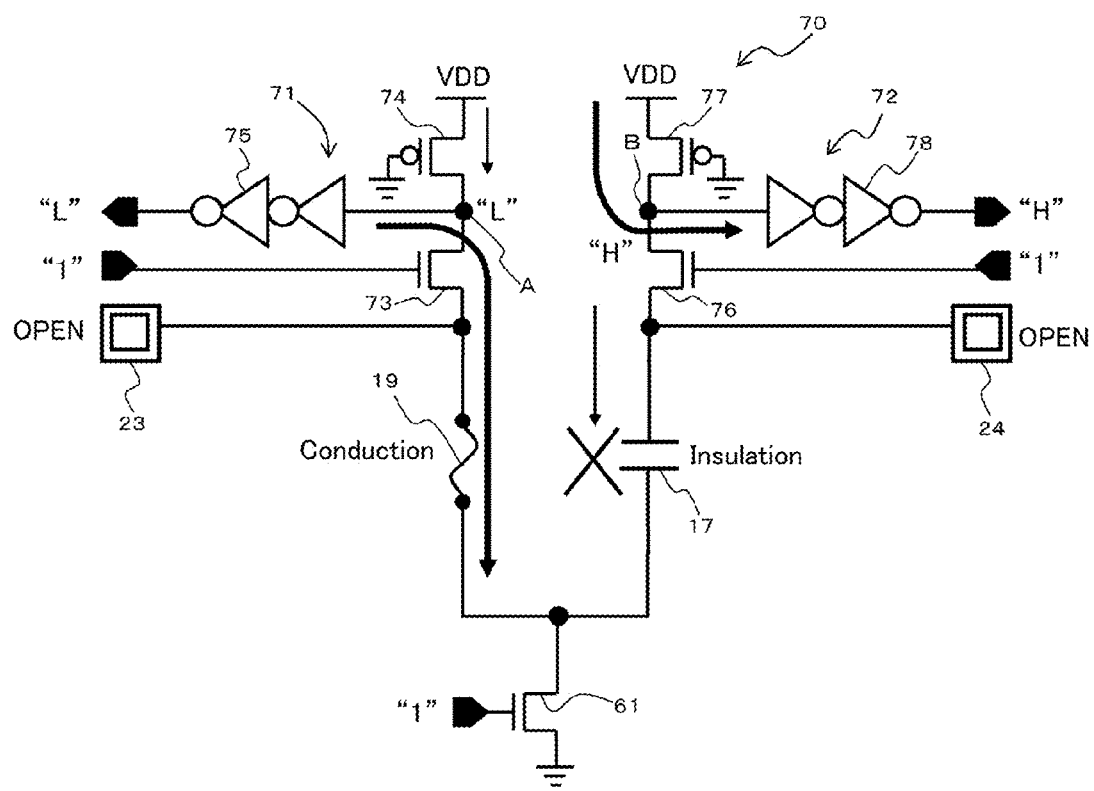
FIG. 15 is a diagram illustrating the operation of a sense circuit coupled to an OTP element included in a semiconductor device according to the present embodiment.

Firstly, the operation of the sense circuit 70 will be described with reference to in the scenario in which both the fuse and anti-fuse elements 19 and 17 are not broken (first state), with reference to FIG. 15.

Firstly, the first and second sense signals to be sent to the gates of the nMOS transistors 73 and 76 are set to "1", the enable signal to be sent to the gate of the nMOS transistor 61 is set to "1", and the first and second pads 23 and 24 are opened. As a result, the sense modes of the fuse and anti-fuse elements 19 and 17 are activated.

In this case, the fuse element 19 is not broken, remains conductive. Thus, the resistivity of the fuse element 19 becomes lower than that of the on-resistance transistor 74 coupled on the side of the power source voltage VDD (on the higher potential side). Thus, the potential at the node A approaches to the potential (0 V) on the ground voltage VSS side (lower potential side), thereby transitioning to the "L" level. The potential at the node A, i.e., "L"-level signal, is amplified by the signal amplification buffer 75, and is then output as the first output signal of the fuse element circuit 71. Note that the left arrow in FIG. 15 indicates the charge at the node A being discharged toward the ground voltage VSS.

In contrast, the anti-fuse element 17 is not broken, remaining insulating. Thus, the resistivity of the anti-fuse element 17 becomes higher than that of the on-resistance transistor 77 coupled on the side of the power source voltage VDD. Thus, the potential at the node B approaches to the potential on power source voltage VDD, thereby transitioning to the "H" level. The potential at the node B, i.e., "H"-level signal, is amplified by the signal amplification buffer 78, and is then output as the second output signal of the anti-fuse element circuit 72. Note that the right arrow in FIG. 15 indicates the node B being charged to approach to the potential on the side of the power source voltage VDD.

Figure 16:
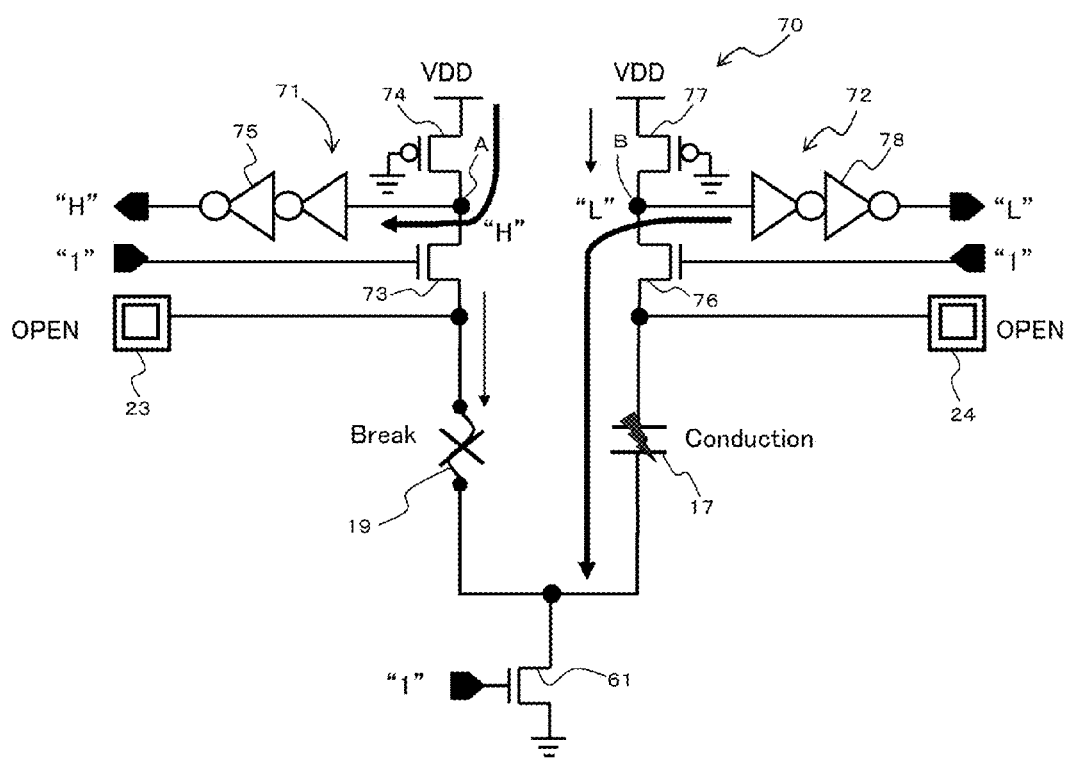
FIG. 16 is a diagram illustrating the operation of a sense circuit coupled to an OTP element included in a semiconductor device according to the present embodiment.
Figure 17:
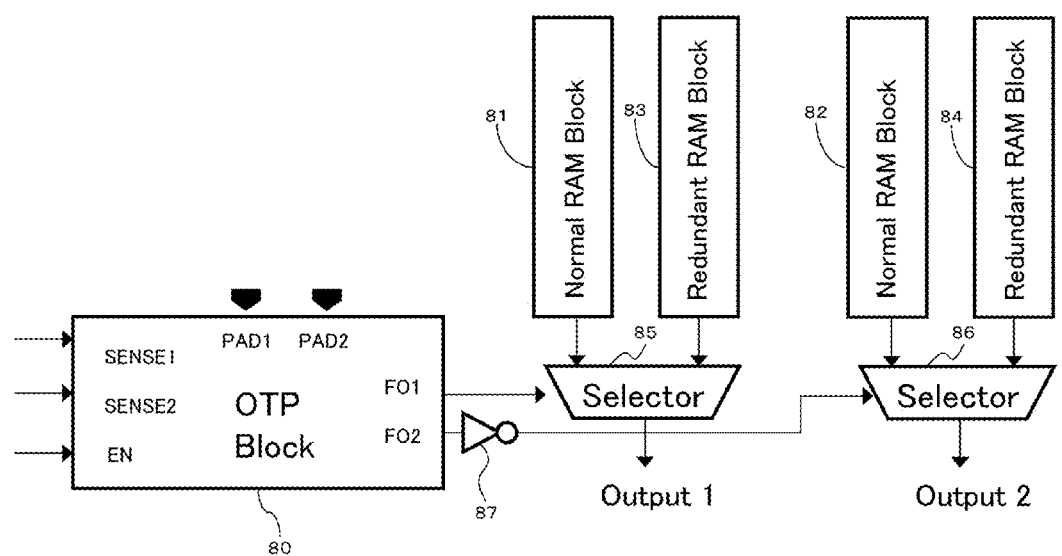
FIG. 17 is a diagram illustrating an example in which an OTP element included in a semiconductor device according to the present embodiment is used for rescuing a fail bit in a memory chip.

Next, the operation of the sense circuit 70 will be described with reference to in the scenario in which both the fuse element 19 and the anti-fuse element 17 are broken (fourth state), with reference to FIG. 16.

Firstly, the first and second sense signals to be sent to the gates of the nMOS transistors 73 and 76 are set to "1", the enable signal to be sent to the gate of the nMOS transistor 61 is set to "1", and the first and second pads 23 and 24 are opened. As a result, the sense modes of the fuse and anti-fuse elements 19 and 17 are activated.

In this case, the fuse element 19 takes the broken state (including higher-resistivity state) due to the break. Thus, the resistivity of the fuse element 19 becomes higher than that of the on-resistance transistor 74 coupled on the side of the power source voltage VDD. Thus, the potential at the node A approaches to the potential on power source voltage VDD, thereby transitioning to the "H" level. The potential at the node A, i.e., "H"-level signal, is amplified by the signal amplification buffer 75, and is then output as the first output signal of the fuse element circuit 71. Note that the left arrow in FIG. 16 indicates the node A being charged to approach to the potential on the side of the power source voltage VDD.

In contrast, the anti-fuse element 17 is broken, remaining conductive. Thus, the resistivity of the fuse element 17 becomes lower than that of the on-resistance transistor 77 coupled on the side of the power source voltage VDD. Thus, the potential at the node B approaches to the potential (0 V) on the ground voltage VSS side (lower potential side), thereby transitioning to the "L" level. The potential at the node B, i.e., "L"-level signal, is amplified by the signal amplification buffer 78, and is then output as the second output signal of the anti-fuse element circuit 72. Note that the right arrow in FIG. 16 indicates the charge at the node B being discharged toward the ground voltage VSS.

A semiconductor device including the OTP element 16 configured as described above can be used for various purposes, including rescuing fail bits in a memory chip, writing chip ID or an encryption code for preventing unauthorized use, or trimming an analog element after it is manufactured.

For example, a fail bit, although the probability thereof is quite low, can be rescued by providing an OTP element 16 described above on a semiconductor device having a large capacity memory, such as a DRAM or SRAM.

In such a case, the semiconductor device may be provided with an OTP block 80 including an OTP element 16, a programming circuit 60, and a sense circuit 70 described above, normal RAM blocks 81 and 82 used as storage in a conventional manner, redundant RAM blocks 83 and 84 used for rescue and selectors 85 and 86.

The normal RAM block 81 and the redundant RAM block 83 may be coupled to the selector 85, and either one of outputs from the normal RAM block 81 and the redundant RAM block 83 may be selected by the selector 85 to be output as an output 1. In addition, the normal RAM block 82 and the redundant RAM block 84 may be coupled to the selector 86, and either one of outputs from the normal RAM block 82 and the redundant RAM block 84 may be selected by the selector 86 to be output as an output 2.

As described above, the selectors 85 and 86 are selector circuits for switching respective outputs from the normal RAM blocks 81 and 82 to outputs from the redundant RAM blocks 83 and 84. The switch operations by the selectors 85 and 86 may be activated in response to the first output signal (FO1) or the second output signal (FO2) output from the sense circuit 70. In other words, the first and second output signals from the sense circuit 70 may be used as switching signals for activating the operations of the selectors 85 and 86.

In addition, an inverter circuit 87 for inversing logic may be coupled between the output terminal of the sense circuit 70 and selector 86, for inversing the logic of the second output signal output from the sense circuit 70.

Specifically, the following procedure may be used.

Firstly, if no fail bit is present in both of the normal RAM blocks 81 and 82, no voltage is applied on both the first pad 23 (PAD 1) and the second pad 24 (PAD 2) in the programming circuit 60 included in the OTP block 80, the enable signal is set to "0", thereby programming a state in which both of the fuse and anti-fuse elements 19 and 17 included in the OTP element 16 are not broken.

Then, without applying a voltage on both of the first and second pads 23 and 24, the first and second sense signals to be sent to the sense circuit 70 included in the OTP block 80 is set to "1", while setting the enable signal to "1". As a result, an "L"-level signal is output as the first output signal, while a "H"-level signal is output as the second output signal, from the sense circuit 70. In this case, the switching signal to be sent to the selector 85 is in the "L" level. In addition, since the "H"-level signal output as the second output signal is inversed by the logic inversing inverter 87, the switching signal to be sent to the selector 86 is also in the "L" level. Accordingly, no switch operation is carried out by the selectors 85 and 86. As a result, the output from the normal RAM block 81 is output, via the selector 85, as an output 1, while the output from the normal RAM block 82 is output, via the selector 86, as an output 2.

Next, if a fail bit is present in the normal RAM blocks 81 while the normal RAM blocks 82 has no fail bit, a voltage is applied to the first pad 23 in the programming circuit 60 included in the OTP block 80, without applying a voltage on the second pad 24, and the enable signal is set to "1", thereby programming a state in which the fuse element 19 included in the OTP element 16 is broken, while the anti-fuse element 17 is not broken.

Then, without applying a voltage on both of the first and second pads 23 and 24, the first and second sense signals to be sent to the sense circuit 70 included in the OTP block 80 is set to "1", while setting the enable signal to "1". As a result, a "H"-level signal is output as the first output signal, and a "H"-level signal is output as the second output signal, from the sense circuit 70. In this case, the switching signal to be sent to the selector 85 is in the "H" level. In addition, since the "H"-level signal output as the second output signal is inversed by the logic inversing inverter 87, the switching signal to be sent to the selector 86 is in the "L" level. This activates the switch operation by the selector 85, while no switch operation is carried out by the selector 86. As a result, the output from the redundant RAM block 83 is output, via the selector 85, as an output 1, while the output from the normal RAM block 82 is output, via the selector 86, as an output 2.

Next, if the normal RAM blocks 81 has no fail bit while a fail bit is present in the normal RAM blocks 82, no voltage is applied on the first pad 23 in the programming circuit 60 included in the OTP block 80, while applying a voltage to the second pad 24, and the enable signal is set to "1", thereby programming a state in which the fuse element 19 included in the OTP element 16 is not broken, while the anti-fuse element 17 is broken.

Then, without applying a voltage on both of the first and second pads 23 and 24, the first and second sense signals to be sent to the sense circuit 70 included in the OTP block 80 is set to "1", while setting the enable signal to "1". As a result, an "L"-level signal is output as the first output signal, and an "L"-level signal is output as the second output signal, from the sense circuit 70. In this case, the switching signal to be sent to the selector 85 is in the "L" level. In addition, since the "L"-level signal output as the second output signal is inversed by the logic inversing inverter 87, the switching signal to be sent to the selector 86 is in the "H" level. This activates the switch operation by the selector 86, while no switch operation is carried out by the selector 85. As a result, the output from the normal RAM block 81 is output, via the selector 85, as an output 1, while the output from the redundant RAM block 84 is output, via the selector 86, as an output 2.

Next, if fail bits are present in both of the normal RAM blocks 81 and 82, a voltage is applied on both of the first and second pads 23 and 24 in the programming circuit 60 included in the OTP block 80, and the enable signal is set to "1", thereby programming a state in which both the fuse element 19 and the anti-fuse element 17 included in the OTP element 16 are broken.

Then, without applying a voltage on both of the first and second pads 23 and 24, the first and second sense signals to be sent to the sense circuit 70 included in the OTP block 80 is set to "1", while setting the enable signal to "1". As a result, a "H"-level signal is output as the first output signal, while an "L"-level signal is output as the second output signal, from the sense circuit 70. In this case, the switching signal to be sent to the selector 85 is in the "H" level. In addition, since the "L"-level signal output as the second output signal is inversed by the logic inversing inverter 87, the switching signal to be sent to the selector 86 is also in the "H" level. This activates the switch operation by the selector 86, and also activates the switch operation by the selector 85. As a result, the output from the redundant RAM block 83 is output, via the selector 85, as an output 1, while the output from the redundant RAM block 84 is output, via the selector 86, as an output 2.

Although the example in which an OTP element 16 is used for rescuing fail bits in a memory chip, this is not limiting and an OTP element may be used for trimming an analog element after it is manufactured, for example, using the principle described above.

Alternatively, the above-described OTP element 16 included in a semiconductor device may be used for writing chip ID, for example. Reverse engineering is becoming increasingly valued due to the recent scaling. For the purpose of reverse engineering, in some cases, chip ID are provided for identifying chip locations on a wafer. Some standards for assuring quality of automobile parts also require provision of chip ID. For such applications, the above-described OTP element 16 may be conveniently utilized for writing chip ID.

For such a purpose, a semiconductor device may include plural OTP blocks 80, each having an OTP element 16, a programming circuit 60, and a sense circuit 70 described above, and a shift register circuit 90, a first electrode pad 91, and a second electrode pad 92, coupled to each of the OTP blocks 80. An enable signal may be sent to each of the plural OTP blocks 80 via the shift register circuit 90, and voltages may be applied to a first pad 23 (PAD 1) and a second pad 23 (PAD 2) in each of the plural OTP blocks 80, via the first and second electrode pads 91 and 92. For example, by providing N OTP blocks 80 in parallel for each chip, 2N bits can be written into the N OTP blocks 80, as a corresponding chip ID. Note that an inverter circuit 93 for inversing logic may be coupled to the output terminal of the sense circuit 70 in each OTP block 80, for inversing the logic of the second output signal output from the sense circuit 70.

In this example, the shift register circuit 90 is adapted to shift an enable signal, and includes plural flip-flop circuits 94. Each of the flip-flop circuits 94 is adapted to receive an enable signal (EN) and a clock signal (CLK). The shift register circuit 90 is operable to shift the enable signal, in response to a clock signal being received in each of the flip-flop circuits 94.

Specifically, the following procedure may be used.

First, for writing chip ID to an OTP element 16 included in each OTP block 80, the particular OTP element 16 to be written is selected by setting the enable signal sent to the OTP block 80 including the OTP element 16 to be written to "1", with the enable signal and the clock signal sent to the shift register circuit 90. Then, both or either one of the fuse and anti-fuse elements 19 and 17 included in the OTP element 16 are broken by applying a voltage to both or either one of the first and second electrode pads 91 and 92.

Figure 18:
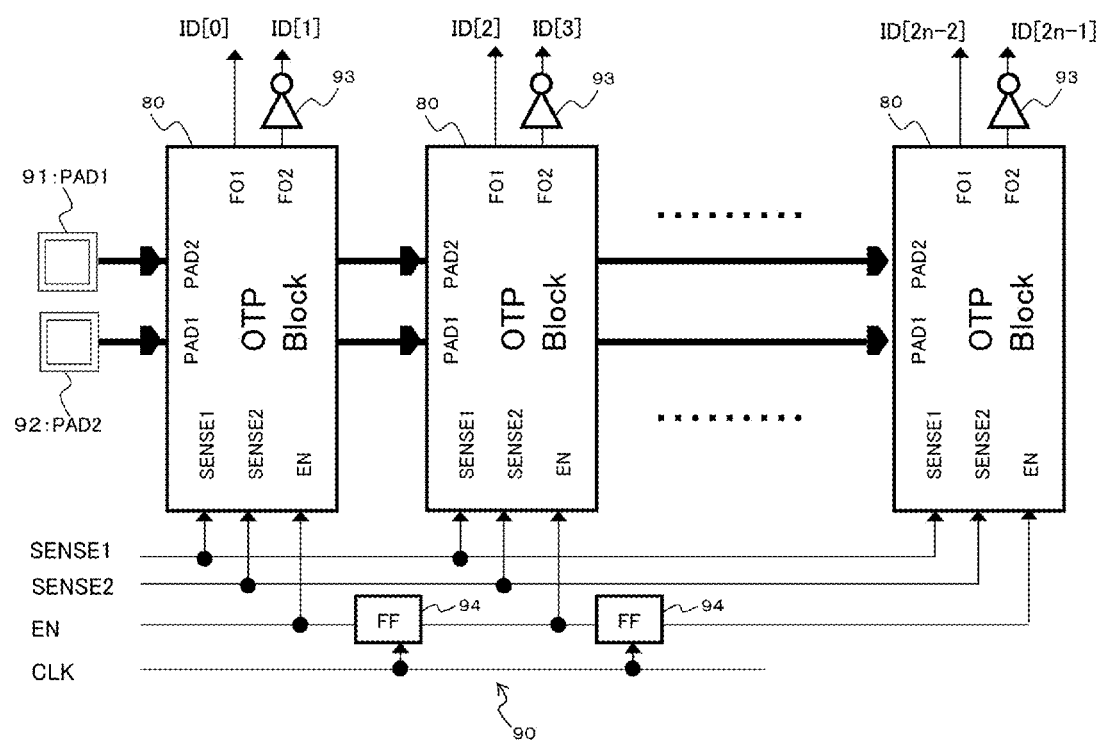
FIG. 18 is a diagram illustrating an example in which an OTP element included in a semiconductor device according to the present embodiment is used for writing chip ID.

Alternatively, for reading chip ID from the OTP element 16 included in each OTP block 80, enable signals to be sent to all of the OTP blocks 80 are set to "1", with the enable signal and the clock signal sent to the shift register circuit 90. In addition, the first sense signals (SENSE1) and second sense signals (SENSE2) to be sent to all of the OTP blocks 80 are set to "1". In addition, when no voltage is applied on both of the first and second electrode pads 91 and 92, no voltage is applied on both of the first and second pads 23 and 24 of all OTP blocks 80. As a result, a "H"- or "L"-level signal is output as a first output signal (FO1) of each OTP block 80, and a "H"- or "L"-level signal is output as a second output signal (FO2). The "H"-level signal or the "L" level output as the second output signal is inverted by the logic inverting inverter 93. In this manner, the chip ID can be detected by reading the first and second output signals output from each OTP block 80. In FIG. 18, the numbers in the brackets in ID[0] to ID[2n−1] represents the bit number in the chip ID.

Although the example in which an OTP element 16 is used for reading or writing chip ID, an OTP element may also be used for writing an encryption code into a chip for preventing unauthorized use of digital contents for enhancing security, for example, using the principle described above.

Accordingly, a semiconductor device and a method of manufacturing the same according to the present embodiment are advantageous in that an OTP element 16, as an memory element, may be integrated into a semiconductor device having transistors 1 and 2, without requiring any additional mask or additional process.

Note that the present embodiment is not limited to the structures of the embodiments set forth above, and may be modified in various manners without departing from the sprit of the present embodiment.

Figure 19A:
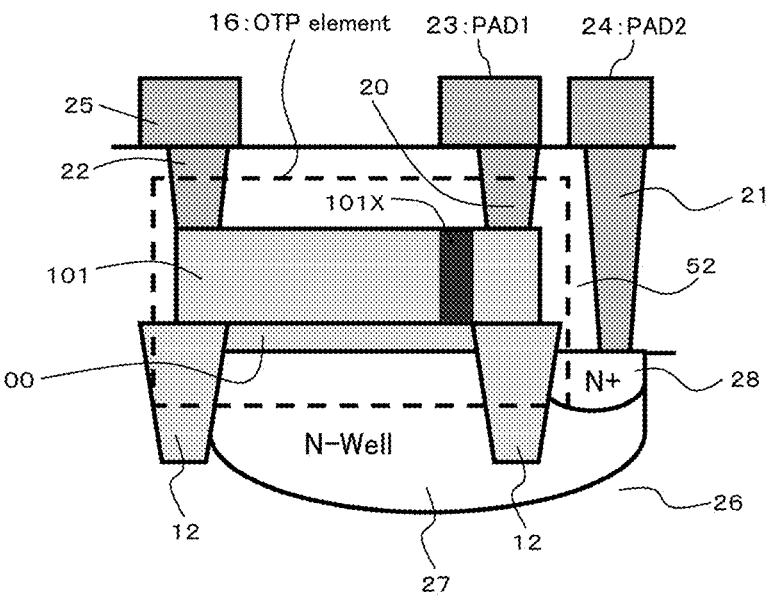
FIG. 19A is a schematic cross-sectional view illustrating the structure of a variant of an OTP element included in a semiconductor device according to the present embodiment.

Although the gate structures and the OTP element 16 have a triple-layered structure stacking an insulator film 17, a polysilicon film 18, and a metal silicide film (metal compound film) 19 in the above-described embodiment, this is not limiting. For example, as depicted in FIG. 19A, the gate structures and the OTP element 16 may have an alternative structure (dual-layered structure) stacking an insulator film 100 and a metal or metal silicide film (metal compound film) 101. In this case, the OTP element 16 may be programmed by inducing or not inducing dielectric breakdown in the insulator film 100, and changing the conductivity of the metal film or metal compound film 101. Note that the metal film or metal compound film 101 included in the gate structure represents a gate electrode. Such a gate is referred to as a metal gate. In addition, the metal film or metal compound film 101 included in the OTP element 16 represents a fuse element, while the insulator film 100 represents an anti-fuse element. The same elements in FIGS. 19A and 19B as those in the above-described first embodiment are referenced by the like reference symbols.

In this case, the metal film 101 is a layer made of any metal material used for a metal gate, such as titanium nitride, for example. In addition, the metal compound film 101 is a layer made of any suitable metal compound material used for a metal gate, e.g., a layer made of a metal silicide material, such as cobalt silicide or nickel silicide, for example.

For an OTP element 16 having a dual-layered structure, presence or absence of insulation breakdown in the insulator film 100, as an anti-fuse element, can be determined by an insulation breakdown portion in the insulator film 100, and the change in the conductivity in the route by way of the metal film or metal compound film 101 as a fuse element.

Figure 19B:
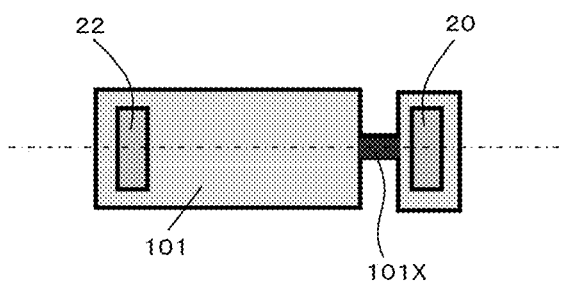
FIG. 19B is a schematic plan view of the OTP element in FIG. 19A.

Thus, in the case where the metal film or metal compound film 101 is broken and breakdown in the insulator film 100 is induced, if the insulation breakdown portion in the insulator film 100 is located closer to the power-source-side contact plug 20 than the break portion in the metal film or metal compound film 101, the sense circuit 70 would erroneously determine the insulator film 100 as non-conducting even if it has been made conductive by inducing the insulation breakdown. For this reason, an OTP element 16 is used having a structure stacking the metal film or metal compound film 101 on the insulator film 100, the metal film or metal compound film 101 preferably has a portion 101X having a width narrower than that of the remaining portion, in the vicinity of the power-source-side contact plug 20, as depicted in FIGS. 19A and 19B. For forming the portion 101X, in the step of forming a metal film or metal compound film in the method of manufacturing a semiconductor device, the metal film or metal compound film 101 having the portion 101X having a width narrower than that of the remaining portion, may be formed, in the vicinity of the region in which the power-source-side contact plug 20. By providing the portion 101X having a width narrower than that of the remaining portion to the metal film or metal compound film 101 in this manner, a cut due to electromigration can be more easily induced in that portion. This can prevent the sense circuit 70 from erroneously determining the insulator film 100 as non-conducting even if it has been made conductive by inducing the insulation breakdown.

Although a metal film or metal compound film is broken by electromigration induced by a current flow in the above embodiment and its variant, this is not limiting. Programming can be achieved by inducing a break of a metal film or metal compound film by a current flow. For example, in a structure stacking a metal silicide film (metal compound film) on a polysilicon film, the metal silicide film on the polysilicon film may be coagulated by means of heat induced by a current flow, thereby causing a break in the metal silicide film (either the film is cut or the resistivity thereof is increased). Alternatively, for example, in an OTP element 16 in the dual-layered or triple-layered structure described above, the metal film or metal compound film is molten by means of heat generated by a current flow, thereby causing a break in the metal silicide film (either the film is cut or the resistivity thereof is increased). In this manner, an OTP element can be programmed in any suitable manner by inducing a break in a metal film or metal compound film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A semiconductor device comprising:
   a memory element including a stack structure stacking an insulator film, and a metal film or a metal compound film, the metal film or the metal compound film being provided over the insulator film;
   a transistor including a gate structure having an identical stack structure as that of the memory element;
   one first power-source-side contact plug coupled to the upper surface of the metal film or the metal compound film;
   one ground-side contact plug coupled to the upper surface of the metal film or the metal compound film; and
   one second power-source-side contact plug coupled to the lower surface of the insulator film,
   wherein the insulator film provided in the memory element is an anti-fuse element programmed into a first state by breaking thereof, and the metal film or the metal compound film provided in the memory element is a fuse element programmed into a second state by breaking thereof.

2. The semiconductor device according to claim 1, wherein the metal compound film is a metal silicide film, and the memory element further includes a polysilicon film stacked on the insulator film and the metal silicide film stacked on the polysilicon film.

3. The semiconductor device according to claim 2, further comprising a programming circuit that programs the anti-fuse element and the fuse element.

4. The semiconductor device according to claim 2, further comprising sense circuit that distinguishes a state of the anti-fuse element and the fuse element.

5. The semiconductor device according to claim 1, wherein the stack structure of the memory element is a stack structure stacking the metal film or the metal compound film on the insulator film, and the metal film or the metal compound film has a width narrower at a portion thereof in the vicinity of the first power-source-side contact plug than the width of a remaining portion thereof.

6. The semiconductor device according to claim 5, further comprising sense circuit that distinguishes a state of the anti-fuse element and the fuse element.

7. The semiconductor device according to claim 1, further comprising a programming circuit that programs the anti-fuse element and the fuse element.

8. The semiconductor device according to claim 1, further comprising sense circuit that distinguishes a state of the anti-fuse element and the fuse element.

9. The semiconductor device according to claim 1, wherein the first power-source-side contact plug is electrically coupled to the ground-side contact plug via the metal film or the metal compound film, and the second power-source-side contact plug is electrically coupled to the ground-side contact plug via the insulator film.

* * * * *